United States Patent
Song et al.

(10) Patent No.: US 9,826,624 B2
(45) Date of Patent: Nov. 21, 2017

(54) DISPLAY DEVICE USING ALIGNMENT MARKS TO ALIGN A FLEXIBLE PRINTED CIRCUIT BOARD AND A CONTROL PRINTED CIRCUIT BOARD

(71) Applicant: Samsung Display Co., Ltd., Yongin (KR)

(72) Inventors: Hyun Seop Song, Bucheon-si (KR); Hyun Jung Son, Asan-si (KR); Kwang Hyun Baek, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 74 days.

(21) Appl. No.: 14/731,145

(22) Filed: Jun. 4, 2015

(65) Prior Publication Data
US 2016/0165725 A1 Jun. 9, 2016

(30) Foreign Application Priority Data
Dec. 8, 2014 (KR) .................. 10-2014-0174890

(51) Int. Cl.
*H05K 5/00* (2006.01)
*H05K 1/02* (2006.01)
*H05K 1/14* (2006.01)
*H05K 1/18* (2006.01)
*H05K 3/36* (2006.01)

(52) U.S. Cl.
CPC .......... *H05K 1/0269* (2013.01); *H05K 1/147* (2013.01); *H05K 1/189* (2013.01); *H05K 3/361* (2013.01); *H05K 2201/053* (2013.01); *H05K 2201/09918* (2013.01); *H05K 2201/10128* (2013.01); *H05K 2203/166* (2013.01)

(58) Field of Classification Search
CPC ............... H01L 23/544; H05K 1/0269; H05K 2201/09918; H05K 2203/166; H05K 3/361; H05K 1/147; H05K 3/303; H05K 1/0266; H05K 3/0008; H05K 1/189; H05K 2201/053; H05K 2203/167; H05K 2201/10128
USPC ................................ 361/749, 756, 777, 802
See application file for complete search history.

(56) References Cited

U.S. PATENT DOCUMENTS 6,519,020 B1 * 2/2003 Cha .................. H05K 1/147
349/149
6,664,942 B1 * 12/2003 Kim .................... G02F 1/13452
345/204

(Continued)

FOREIGN PATENT DOCUMENTS

KR 10-1999-0023339 3/1999
KR 10-2004-0062170 7/2004

(Continued)

*Primary Examiner* — James Wu
(74) *Attorney, Agent, or Firm* — H.C. Park & Associates, PLC

(57) ABSTRACT

A display device includes: a panel substrate configured to display an image; a control printed circuit board to receive an image signal from an external source, to generate data and a control signal based on the image signal, and to provide the data and the control signal to the panel substrate; and a flexible printed circuit board (FPCB) electrically connected to the panel substrate and electrically connected to the control printed circuit board. A first align mark is disposed on the FPCB and a second align mark is disposed on the control printed circuit board.

19 Claims, 5 Drawing Sheets

(56) References Cited

U.S. PATENT DOCUMENTS

2010/0202119 A1* 8/2010 Nagami ............... H05K 1/0281
361/749
2014/0139445 A1* 5/2014 Chen ....................... G06F 3/041
345/173

FOREIGN PATENT DOCUMENTS

| KR | 10-2005-0038100 | 4/2005 |
| KR | 10-2007-0054353 | 5/2007 |
| KR | 10-2007-0062107 | 6/2007 |
| KR | 10-2008-0040483 | 5/2008 |
| KR | 10-2013-0087753 | 8/2013 |

* cited by examiner

DISPLAY DEVICE USING ALIGNMENT MARKS TO ALIGN A FLEXIBLE PRINTED CIRCUIT BOARD AND A CONTROL PRINTED CIRCUIT BOARD

CROSS-REFERENCE TO RELATED APPLICATION

This application claims priority from and the benefit of Korean Patent Application No. 10-2014-0174890 filed on Dec. 8, 2014, which is hereby incorporated by reference for all purposes as if fully set forth herein.

BACKGROUND

Field

Exemplary embodiments relate to a display device, and more particularly, to a display device capable of improving the precision of the coupling between a flexible printed circuit board (FPCB) and a control printed circuit board.

Discussion of the Background

As the "Information Society" continues to develop, the demand for thin, light-weight flat panel display (FPD) devices has steadily increased. Examples of the FPD devices include a liquid crystal display (LCD) device, an electrophoretic display (EPD) device, an organic light-emitting display device, an inorganic electro-luminescent (EL) display device, a field emission display (FED) device, a surface-conduction electron-emitter display (SED) device, a plasma display panel (PDP) device and a cathode ray tube (CRT) display device.

An FPD device includes a display panel where a pixel unit for displaying an image and a driving integrated circuit (IC) unit for controlling the pixel unit are included, a control printed circuit board, which controls the driving IC unit, and a flexible printed circuit board (FPCB), which connects the display panel and the control printed circuit board.

The FPCB and the control printed circuit board are connected by inserting the FPCB into a connector provided at the control printed circuit board.

However, if the FPCB and the connector of the control printed circuit board are coupled together with improper alignment, various problems, such as coupling defects or short circuits in circuit lines for transmitting signals, may occur.

To prevent a misalignment or a coupling defect between an FPCB and a control printed circuit board, the following two methods have been suggested: a first method in which align marks are formed on an FPCB and a second method in which protrusions are formed on an FPCB.

However, as the image quality of display devices increases, the number of lines required for outputting or transmitting signals also increases, and the pitch between such signal outputting or transmitting lines increasingly becomes sophisticated or narrow. Accordingly, the first and second methods may no longer be appropriate to address the occurrence of a misalignment or a coupling defect between an FPCB and a control printed circuit board.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device capable of improving the precision of the coupling between a flexible printed circuit board (FPCB) and a control printed circuit board by forming a first align mark on the FPCB and forming a second align mark, which is an extension of the first align mark, on the control printed circuit board to prevent a misalignment between the FPCB and the control printed circuit board.

Additional aspects will be set forth in the detailed description which follows, and, in part, will be apparent from the disclosure, or may be learned by practice of the inventive concept.

An exemplary embodiment discloses a display device, including: a panel substrate configured to display an image; a control printed circuit board to receive an image signal from an external source, to generate data and a control signal based on the image signal, and to provide the data and the control signal to the panel substrate; and a flexible printed circuit board (FPCB) electrically connected to the panel substrate and electrically connected to the control printed circuit board. A first align mark is disposed on the FPCB and a second align mark is disposed on the control printed circuit board.

An exemplary embodiment also discloses a display device, including: a panel substrate to display an image; a control printed circuit board to receive an image signal from an external source, to generate data and a control signal based on the image signal, and to provide the data and the control signal to the panel substrate; an flexible printed circuit board (FPCB) disposed between the panel substrate and the control printed circuit board and electrically connecting the FPCB and the control printed circuit board; and an align mark that extends from the top of the FPCB to the top of the control printed circuit board when the FPCB and the control printed circuit board being combined and indicates a degree of alignment between the FPCB and the control printed circuit board.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
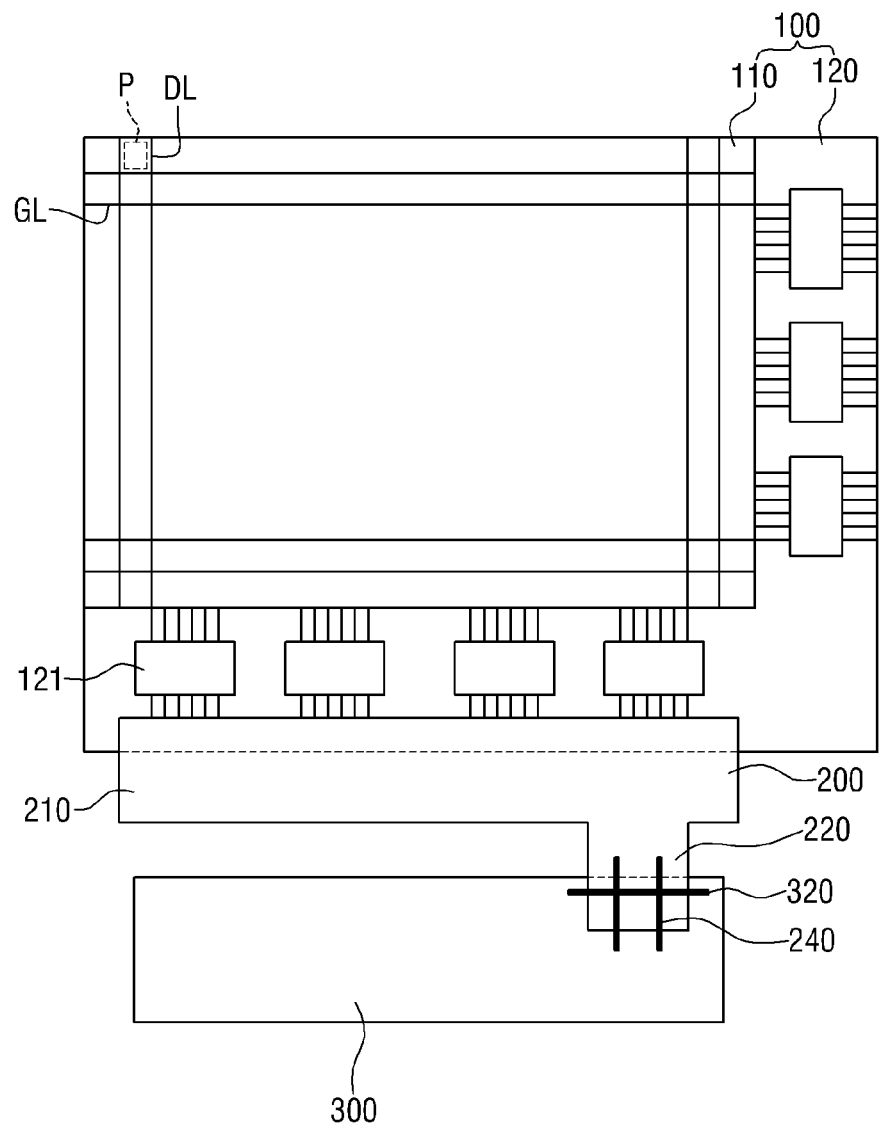
FIG. 1 is a top view of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. As such, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, exemplary embodiments will be described with reference to the attached drawings.

FIG. 1 is a top view of a display device according to an exemplary embodiment.

Referring to FIG. 1, the display device may include panel substrate 100, flexible printed circuit board (FPCB) 200 and control printed circuit board 300.

Panel substrate 100 may include first substrate 110 and second substrate 120, which is larger than first substrate 110. Light-emitting elements (not shown) may be disposed between first and second substrates 110 and 120 so as to display an image. The light-emitting elements may be either liquid crystal light-emitting elements or organic light-emitting diodes (OLEDs), etc.

First substrate 110 may include gate lines GL and data lines DL, which are arranged to form a matrix and receive data and a control signal from control printed circuit board 300, and pixels P, which are defined by gate lines GL and data lines DL. Each of pixels P may include a switching device (for example, thin-film transistors (TFTs)) that is turned on or off in response to a control signal being applied thereto from control printed circuit board 300, and a light-emitting device that emits light under the control of the switching device.

Second substrate 120 may generally be larger than first substrate 110. Accordingly, second substrate 120 may include a non-display area where no image is displayed. Driving integrated circuits (ICs) 121, which apply a driving control signal for driving pixels P that are arranged on first substrate 110, may be provided in the non-display area. Even though not specifically illustrated in FIG. 1, pads that receive data and a control signal from control printed circuit board 300, signal lines for transmitting signals to, or receiving signals from, first substrate 110 or FPCB 200, and power lines for supplying power may be provided in the non-display area where second substrate 120 is connected to FPCB 200.

FPCB 200 may be disposed between panel substrate 100 and control printed circuit board 300. FPCB 200 may be connected to panel substrate 100 at a first side of FPCB 200, and may be connected to control printed circuit board 300 at a second side of FPCB 200. First align mark 240, which is recognizable even to the naked eye when FPCB 200 is electrically connected to control printed circuit board 300, may be formed on the top surface of FPCB 200 at the second side of FPCB 200. First align mark 240 may be combined with second align mark 320, which is formed on control printed circuit board 300, so that first and second align marks 240 and 320 may be perceived as single align mark M together (see FIG. 4). Single align mark M and the structure of FPCB 200 will be described later in further detail.

Control printed circuit board 300 may receive an image signal from an external source (not illustrated), generate data and a control signal based on the image signal, and may transmit the data and the control signal to panel substrate 100 via FPCB 200. Driving ICs 121, which are disposed on panel substrate 110, may be controlled by the data and the control signal. Control printed circuit board 300 may include connector 310, which is for electrically connecting control printed circuit board 300 to FPCB 200. Control printed circuit board 300 may also include second align mark 320, which may be perceived as an extension of first align mark 240 of FPCB 200 and is formed on three sides of connector 310. Second mark 320 may be combined with first align mark 240 so that first and second align marks 240 and 320 may be perceived as a single line in the single align mark M. The structure of control printed circuit board 300 will be described later in further detail.

Figure 2:
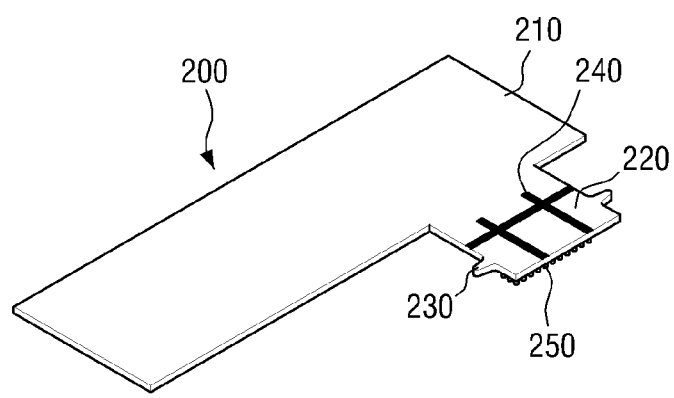
FIG. 2 is a top perspective view of a flexible printed circuit board (FPCB) according to an exemplary embodiment.

FIG. 2 is a top perspective view of an FPCB according to an exemplary embodiment.

Referring to FIG. 2, FPCB 200 may include body portion 210 and protruding portion 220, which protrudes from body portion 210. Protruding portion 220 may include protrusions 230 and first align mark 240.

Body portion 210 may include a base film that includes a flexible material. The base film may include an insulating material, for example, a polyimide (PI) material. Signal lines (not illustrated) for transmitting the data and the control signal output by control printed circuit board 300 to panel substrate 100 may be disposed on a first surface of the base film. Body portion 210 may include a cover film (not illustrated) for protecting signal lines.

Protruding portion 220 may protrude to have a determined length from body portion 210, and may correspond to a second-side portion of FPCB 200, which is to be connected to control printed circuit board 300. Protruding portion 220 may protrude from body portion 210, may include the same material as that of body portion 210, and may have the signal lines formed thereon. Protruding portion 220 may include protrusions 230, which are formed on both sides of protruding portion 220 for coupling FPCB 200 to control printed circuit board 300. Due to protrusions 230, FPCB 200 and control printed circuit board 300 may not be separated from each other, but may be properly combined together. First align mark 240 may be formed on the first surface of protruding portion 220 to ensure the accuracy and/or precision of the coupling between FPCB 200 and control printed circuit board 300 in a manner easily identifiable even to the naked eye. First align mark 240 may be formed by printing a colored ink on FPCB 200 through screen printing at the time of the design of FPCB 200 or by applying a colored tape onto FPCB 200. Coupling portion 250, which is coupled to connector 310 of control printed circuit board 300 to be electrically connected to control printed circuit board 300, may be disposed on a second surface of FPCB 200, which is opposite to the first surface of FPCB 200.

In one or more exemplary embodiments, FPCB 200 may be formed to include body portion 210 and protruding portion 220, as described above, but aspects of the invention are not limited thereto. For example, FPCB 200 may be formed as a single body having a portion corresponding to body portion 210 and a portion corresponding to protruding portion 220 with no distinction between body portion 210 and protruding portion 220 thereof.

Driving ICs 121 may be attached and mounted on panel substrate 100 in a chip-on-glass (COG) manner, but aspects of the invention are not limited thereto. For example, driving ICs 121 may be attached and mounted on panel substrate 100 in a chip-on-film (COF) manner. In the COF example, FPCB 200 may be formed with no distinction between body portion 210 and protruding portion 220 thereof.

Figure 3:
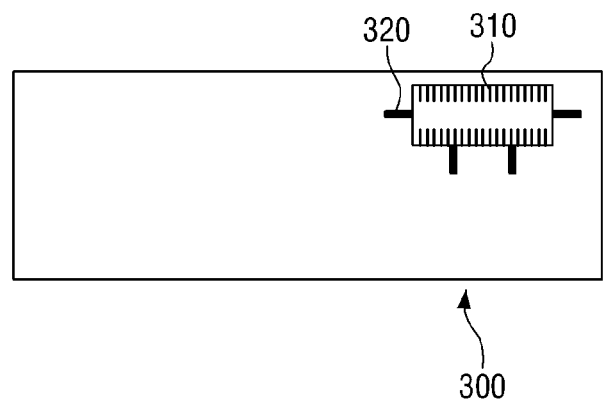
FIG. 3 is a top view of a control printed circuit board according to an exemplary embodiment.
Figure 4:
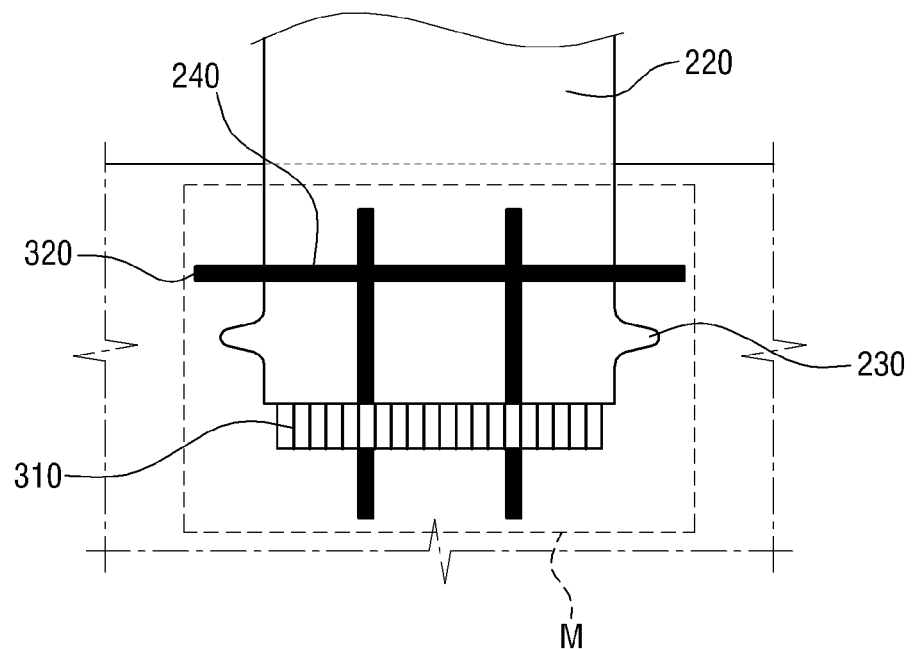
FIG. 4 is a top view illustrating the coupling of the FPCB and the control printed circuit board according to an exemplary embodiment.

FIG. 3 is a top view of a control printed circuit board according to an exemplary embodiment, and FIG. 4 is a top view illustrating the coupling of the FPCB and the control printed circuit board according to an exemplary embodiment.

Referring to FIG. 3, control printed circuit board 300 may include a substrate, which is formed of a rigid material, and connector 310, which is provided on the rigid substrate to be electrically connected to electric elements (not illustrated) and FPCB 200. Connector 310 may be coupled to coupling portion 250 of FPCB 200, as illustrated in FIG. 4. Second align mark 320, which may be perceived as an extension of first align mark 240 on FPCB 200, may be disposed on the rigid substrate on three sides of the connector 310. First align mark 240 may be combined with second align mark 320 so that first and second align marks 240 and 320 may be perceived as single align mark M, together, as illustrated in FIG. 4. Second align mark 320 may be formed by the same method used to form the first align mark 240, i.e., printing a colored ink on control printed circuit board 300 through screen printing at the time of the design of control printed circuit board 300 or by applying a colored tape onto control printed circuit board 300.

FPCB 200 may be connected to control printed circuit board 300 and relatively securely combined thereto due to protrusions 230, as described above. Further, FPCB 200 and control printed circuit board 300 may be electrically connected and physically combined to each other in various methods other than the method and configuration, e.g., protrusions 230, set forth herein.

Figure 5:
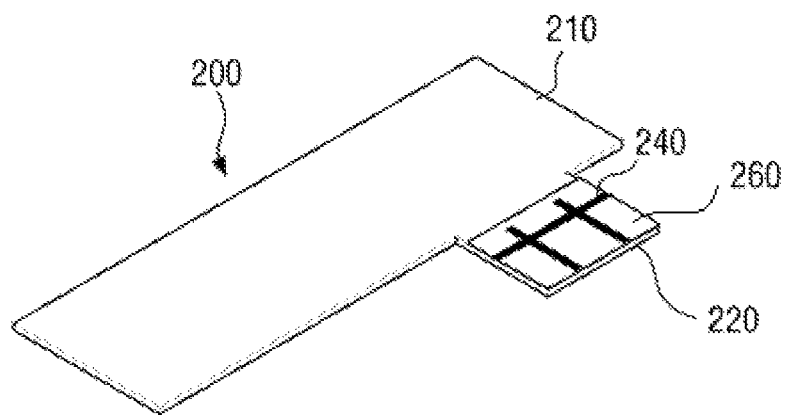
FIG. 5 is a top perspective view of an FPCB according to an exemplary embodiment.
Figure 6:
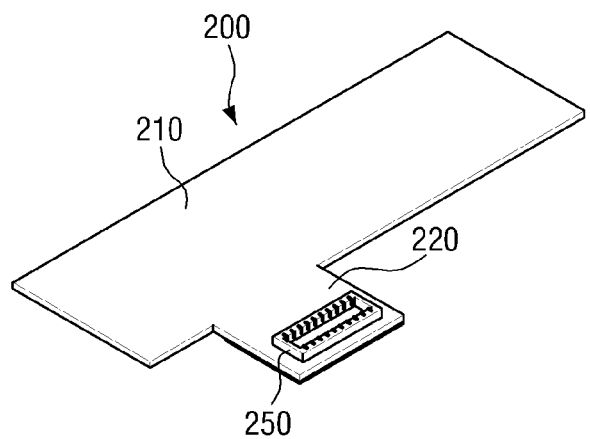
FIG. 6 is a bottom perspective view of the FPCB according to an exemplary embodiment.
Figure 7:
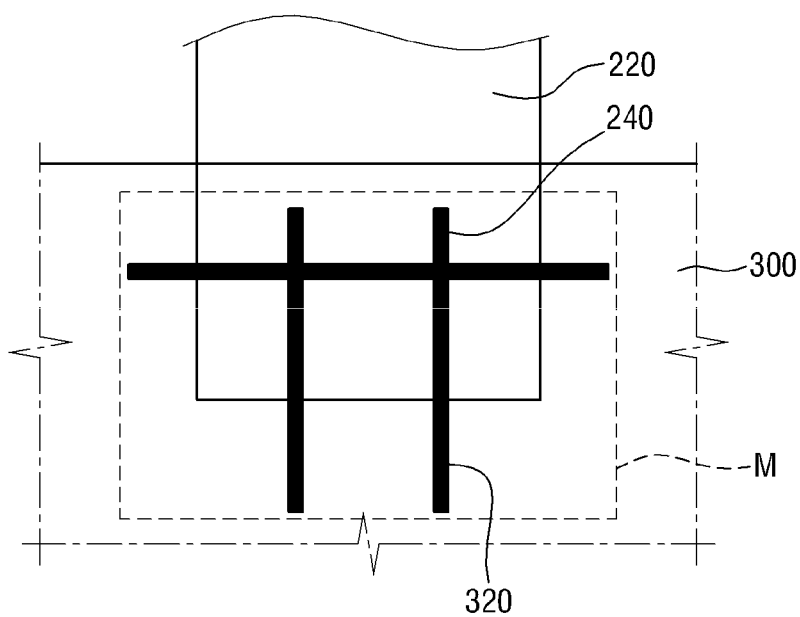
FIG. 7 is a top view illustrating the coupling of the FPCB and a control printed circuit board according to an exemplary embodiment.

FIG. 5 is a top perspective view of an FPCB according to an exemplary embodiment, FIG. 6 is a bottom perspective view of the FPCB according to an exemplary embodiment, and FIG. 7 is a top view illustrating the coupling of the FPCB and a control printed circuit board according to an exemplary embodiment.

Referring to FIG. 5, FPCB 200 may include body portion 210 and protruding portion 220.

FPCB 200 is almost the same as FPCB 200 illustrated in FIG. 2 except for the structure of protruding portion 220, and thus a detailed description of body portion 210 will be omitted.

As illustrated in FIG. 5, protruding portion 220 may protrude to have a determined length from body portion 210. Protruding portion 220, which protrudes from body portion 210, may be formed of the same insulating material as body portion 210, and signal lines may be formed on protruding portion 220. Board portion 260, which extends from the middle to the end of protruding portion 220 and includes a metal material, may be provided on an upper surface of the protruding portion 220. Board portion 260 may facilitate an electrical connection between FPCB 200, which includes a flexible material, and control printed circuit board 300. Referring to FIG. 6, coupling portion 250, which can be electrically connected to connector 310 of control printed circuit board 300, may be provided on the bottom surface of board portion 260. Coupling portion 250 may have a structure corresponding to the structure of connector 310 so as to be coupled to connector 310. For example, as connector 310 is formed to have a protrusion, the coupling portion 250 may be formed to have a recess corresponding to the protrusion. Further, connector 310 may be formed to have a recess, and coupling portion 250 may be formed to have a protrusion corresponding to the recess. Accordingly, FPCB 200 and control printed circuit board 300 may be combined together by aligning connector 310 and coupling portion 250 with each other and pressing board portion 260 against connector 310, while electrically connecting FPCB 200 and control printed circuit board 300 to each other. First align mark 240 may be formed on the top surface of board portion 260 so as to ensure the accuracy and/or precision of the coupling between FPCB 200 and control printed circuit board 300 in a manner easily identifiable even to the naked eye. First align mark 240 may be formed by printing a colored ink on FPCB 200 through screen printing at the time of the design of FPCB 200 or by applying a colored tape onto FPCB 200. First align mark 240 may be aligned with second align mark 320, which is formed on control printed circuit board 300, so that first and second align marks 240 and 320 may be perceived as a single line in single align mark M. Control printed circuit board 300 is the same as, or similar to, control printed circuit board 300 of FIG. 3, and thus, a detailed description thereof will be omitted. To combine FPCB 200 with control printed circuit board 300 correctly, first align mark 240 of FPCB 200 and second align mark 320 of control printed circuit board 300 may be aligned with each other so that they are perceived as a single line in single align mark M.

Figure 8:
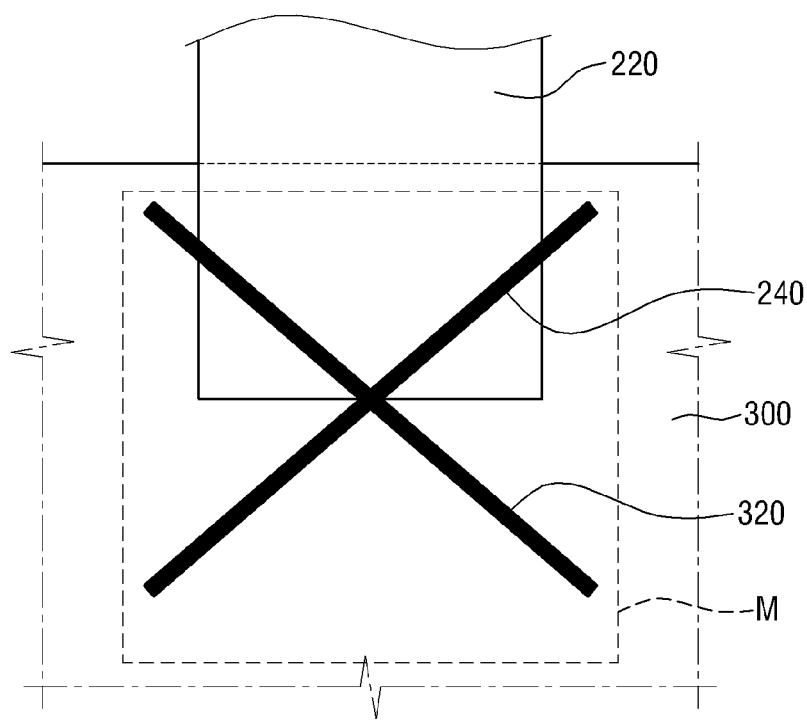
FIG. 8 and FIG. 9 are top views illustrating the coupling of FPCBs and control printed circuit boards according to an exemplary embodiment.
Figure 9:
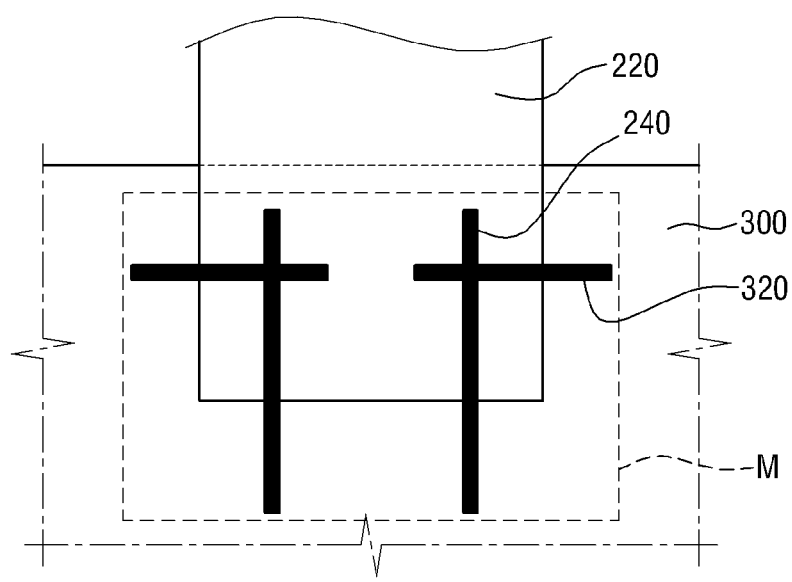

FIG. 8 and FIG. 9 are top views illustrating the structures of the coupling between FPCBs and control printed circuit boards according to an exemplary embodiment.

Referring to FIG. 8, when protrusion 220 of FPCB 200 and control printed circuit board 300 are electrically connected with proper relative positions, first align mark 240 formed on FPCB 200 and second align mark 320 formed on control printed circuit board 300 may be combined with each other and perceived as a single line of align mark M, i.e., an "X" mark.

Referring to FIG. 9, when protrusion 220 of FPCB 200 and control printed circuit board 300 are electrically connected with proper relative positions, first align mark 240 formed on FPCB 200 and second align mark 320 formed on control printed circuit board 300 may be combined with each other and perceived as a single line of align mark M, i.e., a "++" mark.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a panel substrate configured to display an image;
a control printed circuit board configured to receive an image signal from an external source, generate data and a control signal based on the image signal, and provide the data and the control signal to the panel substrate; and
a flexible printed circuit board (FPCB) electrically connected to the panel substrate and electrically connected to the control printed circuit board,
wherein:
a first align mark is disposed on a first surface of the FPCB;
a coupling portion is disposed on a second surface of the FPCB opposite to the first surface of the FPCB;
a connector is disposed on the control printed circuit board;
a second align mark is disposed outside the connector on the control printed circuit board;
the coupling portion is coupled and electrically connected to the connector; and
at least a portion of the first align mark overlaps the coupling portion coupled and electrically connected to the connector, in a plan view.

2. The display device of claim 1, wherein the second align mark is aligned with the first align mark and an extension of the first align mark is perceived when the FPCB and the control printed circuit board are combined.

3. The display device of claim 1, wherein the FPCB comprises a body portion, which is electrically connected to the panel substrate, and a protruding portion, which protrudes with a predetermined length from one side of the body portion and is electrically connected to the control printed circuit board.

4. The display device of claim 3, wherein the body portion comprises a base film including an insulating material and signal lines disposed on the base film.

5. The display device of claim 3, wherein the protruding portion comprises a base film including an insulating material, signal lines disposed on the insulating film, protrusions disposed on both sides of the base film, and the first align mark disposed on the base film.

6. The display device of claim 3, wherein the protruding portion comprises a base film including an insulating material, signal lines disposed on the base film, a board portion disposed on an upper surface of the protruding portion, and the first align mark disposed on the board portion.

7. The display device of claim 1, wherein the control printed circuit board comprises an electric element disposed on a rigid substrate including a rigid material, and the second align mark is disposed on three sides of the connector.

8. The display device of claim 1, wherein the first align mark is formed when manufacturing the FPCB.

9. The display device of claim 1, wherein the second align mark is formed when manufacturing the control printed circuit board.

10. The display device of claim 1, wherein the first and second align marks comprise a colored ink or a colored tape.

11. The display device of claim 1, wherein the FPCB is electrically connected to the panel substrate at a first side thereof and is electrically connected to the control printed circuit board at a second side thereof, and
the first align mark is formed on the FPCB at the second side of the FPCB.

12. A display device, comprising:
a panel substrate configured to display an image;
a control printed circuit board configured to receive an image signal from an external source, generate data and a control signal based on the image signal, and provide the data and the control signal to the panel substrate;
a flexible printed circuit board (FPCB) disposed between the panel substrate and the control printed circuit board and electrically connecting the FPCB and the control printed circuit board; and align marks that are perceived to extend from the top of the FPCB to the top of the control printed circuit board when the FPCB and the control printed circuit board are combined and indicates a degree of alignment between the FPCB and the control printed circuit board, wherein:

the align marks comprise first align marks on the FPCB and second align marks on three sides of a connector disposed on the control printed circuit board to be electrically connected to the FPCB;

the second align marks located on opposite sides among the three sides of the connector are spaced apart from each other on the control printed circuit board; and when viewed in a plan view, at least one of the first align marks is disposed perceived to connect the second align marks located on the opposite sides among the three sides of the connector when the FPCB and the control printed circuit board are combined.

13. The display device of claim 12, wherein the align marks comprise at least one of a colored ink and a colored tape.

14. The display device of claim 12, wherein the align marks are screen-printed align marks.

15. The display device of claim 12, wherein the first align marks are formed when manufacturing the FPCB.

16. The display device of claim 12, wherein the second align marks are formed when manufacturing the control printed circuit board.

17. The display device of claim 15, wherein the FPCB comprises a body portion, which is electrically connected to the panel substrate, and a protruding portion, which protrudes with a determined length from one side of the body portion and is electrically connected to the control printed circuit board, and wherein the first align marks are disposed on the protruding portion.

18. The display device of claim 15, wherein:

the FPCB comprises:

a body portion electrically connected to the panel substrate;

a protruding portion protruding with a determined length from one side of the body portion; and a board portion disposed on the protruding portion; and the first align marks are disposed on the board portion.

19. The display device of claim 12, wherein the first align marks are formed at one side of the FPCB.

* * * * *